US006411092B1

United States Patent
Anderson

(12) 
(10) Patent No.: US 6,411,092 B1
(45) Date of Patent: Jun. 25, 2002

(54) CLAD METAL FOILS FOR LOW TEMPERATURE NMR PROBE RF COILS

(75) Inventor: Weston A. Anderson, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 13 days.

(21) Appl. No.: 09/676,636

(22) Filed: Sep. 30, 2000

(51) Int. Cl.⁷ .................................................. G01V 3/00
(52) U.S. Cl. ....................... 324/319; 324/320; 324/318; 324/307
(58) Field of Search .................. 324/319, 307, 324/310, 316, 318, 320

(56) References Cited

U.S. PATENT DOCUMENTS

| 3,091,732 | A |   | 5/1963 | Anderson et al. | |
| RE31,895 | E |   | 5/1985 | Kneip, Jr. | 324/319 |
| 5,247,256 | A |   | 9/1993 | Marek | 324/321 |
| 5,552,709 | A |   | 9/1996 | Anderson | 324/321 |
| 5,684,401 | A | * | 11/1997 | Peck et al. | 324/318 |
| 5,689,187 | A | * | 11/1997 | Marek et al. | 324/318 |
| 5,831,434 | A | * | 11/1998 | Shigezane et al. | 324/321 |
| 5,929,639 | A |   | 7/1999 | Doty | 324/318 |
| 5,986,453 | A | * | 11/1999 | Anderson et al. | 324/300 |
| 6,054,855 | A | * | 4/2000 | Anderson | 324/307 |
| 6,060,882 | A |   | 5/2000 | Doty | 324/318 |
| 6,087,832 | A |   | 7/2000 | Doty | 324/318 |

FOREIGN PATENT DOCUMENTS

DE    198 44 895.3-42    9/1998

OTHER PUBLICATIONS

Internet article entitled "How the Sample and Probe Affect Shimming", http://pc16002.pharmazie.uni–marburg.de/www/shim_html/sample.htm, pp. 1–14, Acorn NMR, Inc. last updated: Feb. 19, 1998.

* cited by examiner

Primary Examiner—Edward Lefkowitz
Assistant Examiner—Dixomara Vargas
(74) Attorney, Agent, or Firm—Bella Fishman; Andrei Popovici

(57) ABSTRACT

Low-temperature (cryogenic) radio-frequency (RF) coils for nuclear magnetic resonance (NMR) applications include composite multi-layered structures including an internal normal metal layer clad on both sides by external high-purity annealed aluminum layers. The magnetic susceptibilities of the internal and external layers are opposite in sign, and the thicknesses of the layers are chosen such that the composite structure has a net magnetic susceptibility equal to that of its surroundings (vacuum or support material). The internal layer can have a higher resistivity and magnetoresistance than the external layers. The use of high-purity, annealed aluminum for the external layers allows relatively high Q-factors for the cryogenic coils.

13 Claims, 2 Drawing Sheets

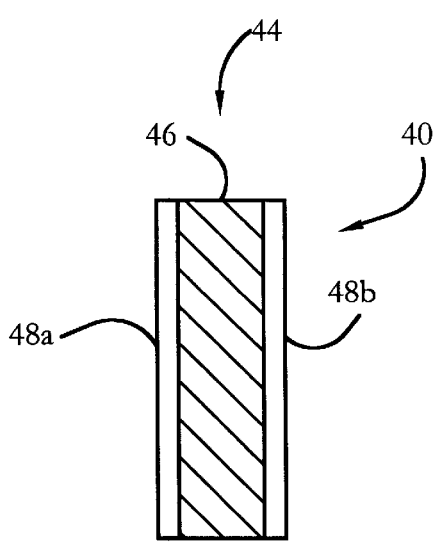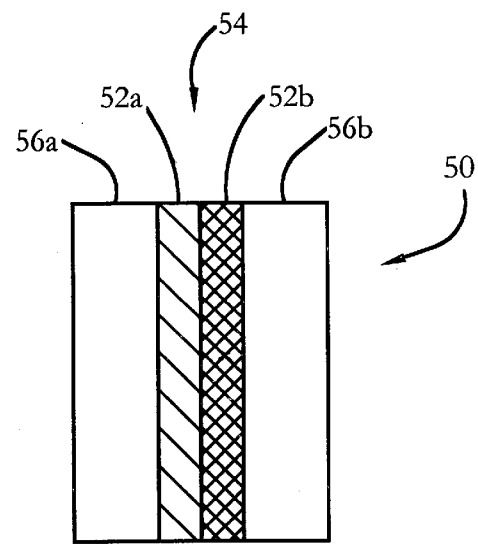
FIG. 3-A FIG. 3-B

CLAD METAL FOILS FOR LOW TEMPERATURE NMR PROBE RF COILS

FIELD OF THE INVENTION

The invention in general relates to nuclear magnetic resonance (NMR) spectroscopy, and in particular to a low-temperature radio-frequency coil for an NMR probe.

BACKGROUND OF THE INVENTION

Nuclear magnetic resonance (NMR) spectrometers typically include a superconducting magnet for generating a static magnetic field $B_0$, and special-purpose radio-frequency (RF) coils for generating time-varying magnetic fields $B_1$, perpendicular to the field $B_0$. Each RF coil resonates at the Larmor frequency of a nucleus of interest. The RF coils are typically provided as part of an NMR probe, and are used to analyze samples situated in test tubes or flow cells. The direction of the static magnetic field $B_0$ is commonly denoted as the z-axis, while the plane perpendicular to the z-axis is commonly termed the x-y plane.

The sensitivity of an NMR spectrometer can be limited by its RF coils. In particular, conventional room-temperature copper coils can have limited Q-factors, which can limit measurement sensitivities. High-temperature superconductor (HTS) coils have been proposed as alternatives to conventional room-temperature coils. HTS coils allow higher Q-factors than conventional room-temperature coils. Typical HTS materials have relatively high diamagnetic susceptibilities, however, and thus can significantly disturb the uniformity of applied external magnetic fields. Magnetic field non-uniformities lead to line-broadening, and can limit measurement sensititivities. Furthermore, conventional HTS materials may not support the RF currents required for some NMR experiments.

SUMMARY OF THE INVENTION

The present invention provides low-temperature radio-frequency coils and systems for nuclear magnetic resonance applications. In particular, the present invention provides a nuclear magnetic resonance spectrometer comprising a magnet for applying a static magnetic field $B_0$ to a nuclear magnetic resonance sample, and a nuclear magnetic resonance probe comprising a susceptibility-compensated cryogenic normal metal radio-frequency coil for applying a radio-frequency magnetic field to the sample. The radio-frequency coil includes an internal normal metal layer, and a pair of external normal metal layers cladding the internal layer. The internal layer has a first magnetic susceptibility and a first conductivity at the operating temperature. The pair of external layers have a second magnetic susceptibility opposite in sign to the first magnetic susceptibility, and a second conductivity that is preferably higher than the first conductivity. In the preferred embodiment, the external layers are made of pure aluminum while the internal layer is made of copper.

BRIEF DESCRIPTION OF THE DRAWINGS

The foregoing aspects of the present invention will become better understood upon reading the following detailed description and upon reference to the drawings where:

FIG. 3-A shows a longitudinal sectional view of part of a radio-frequency coil according to the preferred embodiment of the present invention.

FIG. 3-B shows a longitudinal view of part of a radio-frequency coil according to an alternative embodiment of the present invention.

DETAILED DESCRIPTION OF THE INVENTION

In the following description, the terms "cryogenic" and "low-temperature" are understood to refer to temperatures below 30 K. The term "longitudinal" is understood to refer to the magnetic field z-axis. The term "transverse" refers to the x-y plane defined by the magnetic field. Unless otherwise noted, recited properties (e.g. resistivity, susceptibility) for RF coil materials are understood to refer to the properties as measured at a cryogenic operating temperature of the RF coil. Unless otherwise specifically stated, the terms "layer," "foil," and the like are understood not to be limited to monolithic structures. A layer can in turn comprise plural other layers. A set of elements is understood to consist of one or more elements. The statement that a coil is "susceptibility-compensated" is understood to mean that the coil comprises a conductor formed by a set of paramagnetic layers and a set of diamagnetic layers, wherein the difference between the net magnetic susceptibility of the conductor and the magnetic susceptibility of the conductor's surroundings is less than one fifth of the net magnetic susceptibility of the conductor's diamagnetic or paramagnetic layer(s). The statement that a first layer is attached to a second layer is understood to encompass a first layer directly bonded to a second layer, as well as a first layer attached to a second layer through an intermediate layer positioned between the first and second layers.

The following description illustrates embodiments of the invention by way of example and not necessarily by way of limitation.

Figure 1:
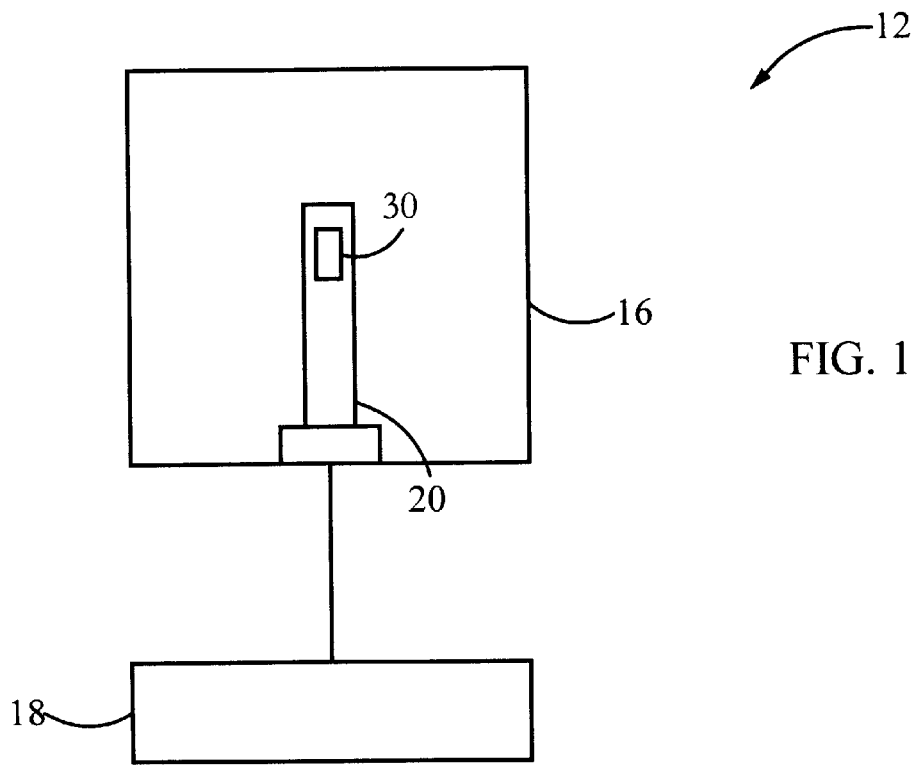
FIG. 1 shows a schematic view of a nuclear magnetic resonance (NMR) spectrometer according to the present invention.

FIG. 1 is a schematic diagram illustrating a nuclear magnetic resonance (NMR) spectrometer 12. Spectrometer 12 comprises a magnet 16, an NMR probe 20 inserted in a bore of magnet 16, and a control/acquisition system 18 electrically connected to magnet 16 and probe 20. Probe 20 holds NMR samples of interest. Magnet 16 applies a static longitudinal magnetic field $B_0$ to the samples. Control/acquisition system 18 applies desired radio-frequency pulses to probe 20, controls the temperature of probe 20, and acquires data indicative of the nuclear magnetic resonance properties of the samples within probe 20.

Probe 20 includes one or more radio-frequency (RF) coils 30 for applying radio-frequency magnetic fields $B_1$ to the samples of interest, and/or for measuring the response of the samples to the applied magnetic fields. Each RF coil 30 is electromagnetically coupled to the sample of interest, and is electrically connected to control/acquisition system 18. Probe 20 further includes conventional temperature-control components such as a cryostat thermally coupled to RF coils 30, for maintaining RF coils 30 at a desired cryogenic operating temperature. The cryogenic operating temperature is less than or substantially equal to about 30 K, preferably less than 30 K.

Figure 2:
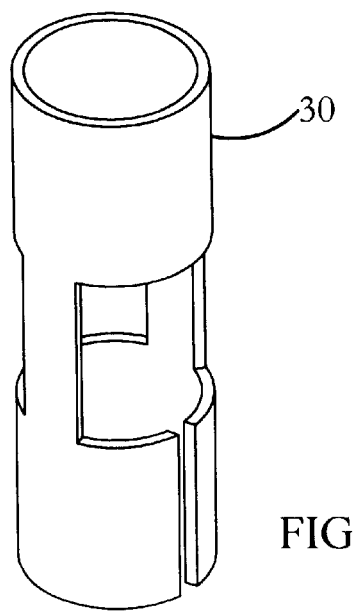
FIG. 2 shows a perspective view of a saddle-shape coil geometry suitable for use in a coil of the present invention.

FIG. 2 illustrates a suitable saddle-shaped geometry for an RF coil 30. RF coil 30 can be wrapped around an internal support quartz or sapphire tube, while an external support quartz or sapphire tube can be slid over coil 30 to hold it in place. Suitable geometries and support structures for NMR RF coils are well known in the art. RF coil 30 can further include a shielding sleeve as described by Hill et al. in U.S. Pat. No. 5,192,911, "NMR Probe Incorporating RF Shielding of Sample." RF coil 30 can also have multiple turns, as described in for example in U.S. Pat. No. 5,818,232 "Saddle-shaped multiturn RF coils for NMR probe."

FIG. 3-A shows a longitudinal cross-section through an RF coil conductor 40 according to the preferred embodiment of the present invention. Conductor 40 comprises a plurality of stacked conducting layers (sheets) 44. Each layer 44 is preferably formed by a homogeneous metal foil, but may generally comprise more than one monolithic structure or layer. Conductor 40 may be stacked onto or surrounded by a non-conductive support material such as quartz, sapphire, glass, or a ceramic material.

Conductor 40 includes an internal conductive layer 46, and two identical external conductive layers 48a–b. Each of layers 46, 48a–b is formed by a normal (non-superconducting) metal. Layers 48a–b laterally enclose layer 46, and are attached to layer 46 on opposite sides of layer 46. The thickness of each layer 48a–b can range from tens to hundreds of microns, and is preferably on the order of one to a few hundred m (tenths of a mm). The thickness of each layer 48a–b is preferably chosen to be higher than the skin depth of each layer 48a–b. Current flow through conductor 40 occurs primarily through external layers 48a–b, and the net resistivity of conductor 40 is determined in large part by the resistivity of layers 48a–b. Layer 46 can have a higher resistivity and magnetoresistance than external layers 48a–b.

The volume magnetic susceptibility of internal layer 46 is opposite in sign to the magnetic susceptibility of external layers 48a–b. For example, if internal layer 46 is diamagnetic, external layers 48a–b are paramagnetic. Using layers of opposite magnetic susceptibilities allows compensating for the magnetic susceptibilities of each individual layer, thus reducing any distortions introduced by the RF coils into applied magnetic fields.

The net or effective magnetic susceptibility of conductor 40 is preferably substantially equal to that of its surroundings. If conductor 40 is embedded in a support material, the net magnetic susceptibility of conductor 40 is preferably equal to the susceptibility of the support material. If conductor 40 is surrounded by vacuum, the net susceptibility of conductor 40 is preferably close to zero, e.g. less than 20% or 10% of the net susceptibility of all the paramagnetic or diamagnetic parts of conductor 40. The thicknesses of layers 44 can be chosen so as to provide a desired net magnetic susceptibility for conductor 40.

In the preferred embodiment, external layers 48a–b are formed by pure aluminum, while internal layer 46 is formed by a diamagnetic material such as copper. Other diamagnetic normal metals suitable for layer 46 include silver, gold, beryllium, and lead. The purity of the aluminum forming layers 48a–b is preferably higher than 99.99%, ideally higher than 99.999%. Impurities and other defects in layers 48a–b increase the resistivity of conductor 40 and reduce the quality (Q) factor of the RF coil.

Maintaining low levels of impurities and dislocations within layers 48a–b is particularly desirable since layers 48a–b are held at a cryogenic operating temperature. At low temperatures, the mean free path of electrons is typically much longer than at room temperature. While at room temperature the mean free path of electrons is typically limited by phonons, at low temperatures the mean free path can be limited by impurities and dislocations.

Aluminum is preferred for the outside layers because of its relatively low resistivity and magnetoresistance, which allow achieving higher Q-factors with aluminum coils than with conventional copper coils, particularly in the presence of applied magnetic fields. Coils made from 99.999%-pure aluminum were empirically determined to have higher Q-factors than corresponding copper coils. Table 1 shows several empirically-determined Q-factors for pure aluminum and copper coils, in the presence and absence of an applied static magnetic field $B_0$.

TABLE 1

| Thickness/Metal | Annealing | Q @ frequency (Mhz) | $B_0$ |
|---|---|---|---|
| 0.002" Al | 200° C., 2 Hr, Air | 3630 @ 571 | 0 |
| 0.002" Al | 200° C., 2 Hr, Air | 3680 @ 571 | 9.4 T |
| 0.002" Cu | 800° C., 0.25 Hr, FG | 1950 @ 579 | 9.4 T |
| 0.002" Cu | 800° C., 0.25 Hr, FG | 3020 @ 590 | 0 |

The measurements were taken at 20 K. The aluminum foil was annealed in air while the copper foil was annealed in forming gas (FG), 5% $H_2$, 95% $N_2$. The aluminum and copper foils were commercially obtained from Goodfellow Corp. and Westco, respectively. As illustrated, the Q-factor for the copper coil dropped by about ⅓ in the presence of the applied static magnetic field, while the Q-factor for the aluminum coil did not change within the accuracy of the measurement. Preliminary measurements on a susceptibility-compensated, 0.005" Al—Cu—Al RF coil annealed at 400 C for 1 hr yielded a Q-factor of 2350 at 456 MHz.

The magnetic susceptibilities of Al and Cu are $_{Al}$=1.65 ppm and $_{cu}$=−0.762 ppm (cgs). For a free-standing conductor formed by aluminum and copper, a total copper thickness of about twice the total aluminum thickness is preferably used to achieve susceptibility compensation. If the conductor is formed by an Al—Cu—Al stack with identical Al layers on both sides, the thickness of the internal copper layer is preferably about 4 times the thickness of each external aluminum layer.

In practice, exact layer thicknesses and coil annealing conditions can be tailored empirically to achieve a desired level of susceptibility compensation at the operating temperature of the coil. Table 2 shows exemplary measured susceptibilities for an annealed and an unannealed Al—Cu—Al foil at room temperature (298 K) and at a cryogenic temperature (25 K).

TABLE 2

| Temperature | Annealing | (ppb) (cgs) | Mass |
|---|---|---|---|
| 298 K | none | −33 | 6.0 mg |
| 25 K | none | −39 | 6.0 mg |
| 298 K | 400° C., 1 hr, air | −23 | 6.5 mg |
| 25 K | 400° C., 1 hr, air | −31 | 6.5 mg |

As illustrated, the measured effective susceptibilities for the Al—Cu—Al foils are substantially lower than the susceptibilities of pure copper and aluminum. Further susceptibility compensation can be achieved by empirically tailoring layer thicknesses.

Other suitable materials for the layers of conductor 40 include silver, gold, platinum, palladium, lead, and beryllium. Table 3 shows resistivities at 4 K, 20 K, and 25 K for four normal metals, as described in a survey by Hall, "Survey of Electrical Resistivity Measurements on 16 pure metals in the temperature range 0 to 273 K," *NBS Technical Note* 365, February 1968. The data shown in Table 3 are the lowest values in the survey by Hall.

TABLE 3

| Metal | at 4 K (-cm) | at 20 K (-cm) | at 25 K (-cm) |
|---|---|---|---|
| Aluminum | $1 \times 10^{-4}$ | $6 \times 10^{-4}$ | $1.5 \times 10^{-3}$ |
| Copper | $1.1 \times 10^{-4}$ | $8 \times 10^{-4}$ | $1.5 \times 10^{-3}$ |
| Beryllium | $3.2 \times 10^{-3}$** | $5 \times 10^{-3}$ | $5.7 \times 10^{-3}$ |
| Silver | $7.5 \times 10^{-4}$ | $4.2 \times 10^{-3}$ | $8.3 \times 10^{-3}$ |

**Extrapolated Value.

Suitable materials such as the ones listed above do not contain nuclei that interfere with typical NMR measurements, and can be manufactured to controlled thicknesses.

An Al—Cu—Al clad metal foil as illustrated in FIG. 3-A can be ordered commercially, for example from Clad Metal Specialties, Bayshore, New York. Individual Cu and Al foils are hot-pressed together to form a layered structure as illustrated in FIG. 3-A. Individual foils and/or the layered structure are annealed under conditions suitable for reducing their resistivities. Annealing at a temperature of at least 200–400° C. for a period of at least 1 hour in an inert atmosphere has been empirically observed to be suitable for an Al—Cu—Al layered foil as described above. Annealing reduces dislocations such as slip-planes in the crystalline lattice of a material. Reducing dislocations allows reducing the material resistivity. Annealing can also slightly affect the magnetic susceptibility of the foil, as illustrated above in Table 2.

FIG. 3-B shows a longitudinal cross-section through an RF coil conductor 50 according to an alternative embodiment of the present invention. Conductor 50 includes a composite internal layer 54 comprising two separate monolithic layers 52a–b. Layer 54 is clad on both sides by external monolithic layers 56a–b. The magnetic susceptibilities of the various layers of conductor 50 are chosen such that the difference between the net susceptibilities of the paramagnetic layers and the diamagnetic layers is substantially equal to the net susceptibility of the surroundings of conductor 50.

It will be clear to one skilled in the art that the above embodiments may be altered in many ways without departing from the scope of the invention. For example, the coil conductor may include a composite structure with more than three layers. Various normal metals may be used for the diamagnetic and paramagnetic layers of the coil. The above experimental results are given for exemplary purposes only, and are not intended to limit the invention. Accordingly, the scope of the invention should be determined by the following claims and their legal equivalents.

What is claimed is:

1. A nuclear magnetic resonance spectrometer comprising:
  a) a magnet for applying a static magnetic field $B_0$ to a nuclear magnetic resonance sample; and
  b) a nuclear magnetic resonance probe comprising a cryogenic susceptibility-compensated radio-frequency coil for applying a radio-frequency magnetic field to the sample, the coil comprising
    an internal copper layer, and
    a pair of external annealed aluminum layers of a purity exceeding 99.99% attached to the internal layer on opposite sides of the internal layer;
    wherein a thickness of the internal layer and a total thickness of the pair of external layers are chosen such that the coil is susceptibility-compensated.

2. The spectrometer of claim 1, wherein an impurity fraction in the external aluminum layers is less than $10^{-5}$.

3. A susceptibility-compensated cryogenic radio-frequency coil for a nuclear magnetic resonance probe, comprising:
  a) an internal copper layer; and
  b) a pair of external annealed aluminum layers of a purity exceeding 99.99% attached to the internal layer on opposite sides of the internal layer;
    wherein a thickness of the internal layer and a total thickness of the pair of external layers are chosen such that the coil is susceptibility-compensated.

4. The coil of claim 3, wherein an impurity fraction in the external aluminum layers is less than $10^{-5}$.

5. A nuclear magnetic resonance probe comprising:
  a) a susceptibility-compensated cryogenic radio-frequency coil for applying a radio-frequency magnetic field to the sample, the coil comprising:
    an internal copper layer, and
    a pair of external annealed aluminum layers of a purity exceeding 99.99% attached to the internal layer on opposite sides of the internal layer,
    wherein a thickness of the internal layer and a total thickness of the pair of external layers are chosen such that the coil is susceptibility-compensated; and
  b) temperature control components thermally coupled to the coil, for maintaining the coil at a cryogenic operating temperature.

6. The probe of claim 5, wherein an impurity fraction in the external aluminum layers is less than $10^{-5}$.

7. A susceptibility-compensated cryogenic radio-frequency coil for a nuclear magnetic resonance probe, comprising a copper foil clad on each of two opposite sides by an external aluminum foil.

8. The coil of claim 7, wherein the aluminum foil is formed substantially by aluminum of a purity exceeding 99.99%.

9. The coil of claim 8, wherein the aluminum foil on each side of the copper foil has a thickness substantially equal to one fourth of a thickness of the copper foil.

10. A susceptibility-compensated, multi-layered cryogenic radio-frequency coil for a nuclear magnetic resonance probe, comprising a surface layer formed by aluminum of a purity exceeding 99.99%, and an internal layer formed by a diamagnetic normal metal.

11. The coil of claim 10, wherein the internal layer has a first conductivity at a cryogenic operating temperature of the coil, and the surface layer has a second conductivity higher than the first conductivity at the operating temperature.

12. The coil of claim 10, wherein the internal layer is formed substantially by copper.

13. The coil of claim 10, wherein the internal layer if formed by a material selected from silver, gold, beryllium, and lead.

* * * * *